United States Patent [19]
Odake

[11] Patent Number: 6,165,825
[45] Date of Patent: Dec. 26, 2000

[54] SEMICONDUCTOR DEVICE AND METHOD FOR PRODUCING THE SAME

[75] Inventor: Yoshinori Odake, Osaka, Japan

[73] Assignee: Matsushita Electronics Corporation, Osaka, Japan

[21] Appl. No.: 09/047,353

[22] Filed: Mar. 25, 1998

[30] Foreign Application Priority Data

Mar. 28, 1997 [JP] Japan ................................ 9-076824

[51] Int. Cl.⁷ .............................................. H01L 21/8238
[52] U.S. Cl. .................... 438/217; 438/229; 438/275; 438/276
[58] Field of Search ................................ 438/199, 217, 438/229, 275, 276

[56] References Cited

U.S. PATENT DOCUMENTS

| 5,283,200 | 2/1994 | Okamoto . |
| 5,527,722 | 6/1996 | Hutter et al. . |
| 5,824,560 | 10/1998 | Van Der Wel et al. . |

FOREIGN PATENT DOCUMENTS

| 61-226968 | 10/1986 | Japan . |
| 01114069 | 5/1989 | Japan . |
| 02192160 | 7/1990 | Japan . |
| 02197173 | 8/1990 | Japan . |
| 03231456 | 10/1991 | Japan . |

*Primary Examiner*—Long Pham
*Attorney, Agent, or Firm*—McDermott, Will & Emery

[57] ABSTRACT

LOCOS layers for defining NMOSFET and PMOSFET forming regions Rn and Rp are formed, and then a protective oxide layer is formed. A first resist layer, opened above the region Rn, is then formed on the protective oxide layer. By using the first resist layer as a mask, ion implantation is performed twice to form a threshold control layer and a P-layer functioning as a punch-through stopper or the like. By using the first resist layer as a mask, the substrate is etched to remove a portion of the protective oxide layer. Then, the first resist layer is removed. These processes are also performed on the region Rp. Then, a gate oxide layer is formed. Thus, it is possible to prevent a foreign impurity, introduced during the ion implantation, from diffusing the surrounding regions when the resist layers are removed. As a result, the properties of the gate oxide layer can be improved.

15 Claims, 11 Drawing Sheets

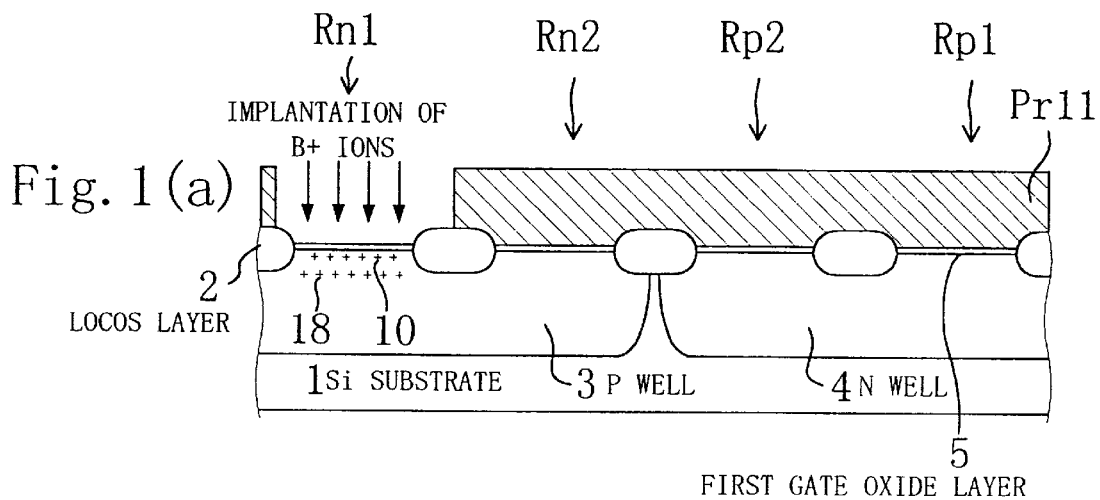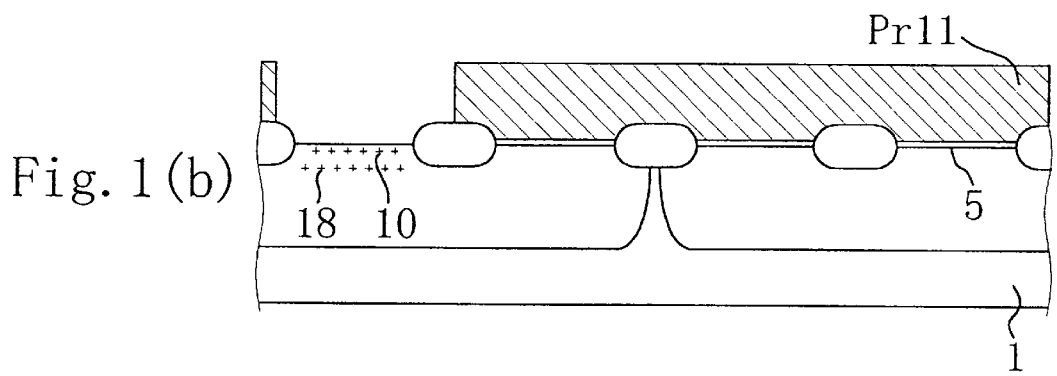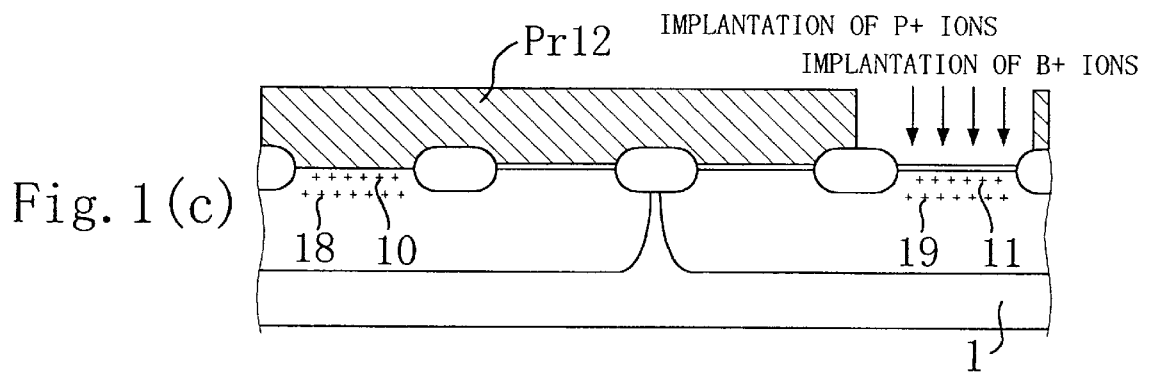

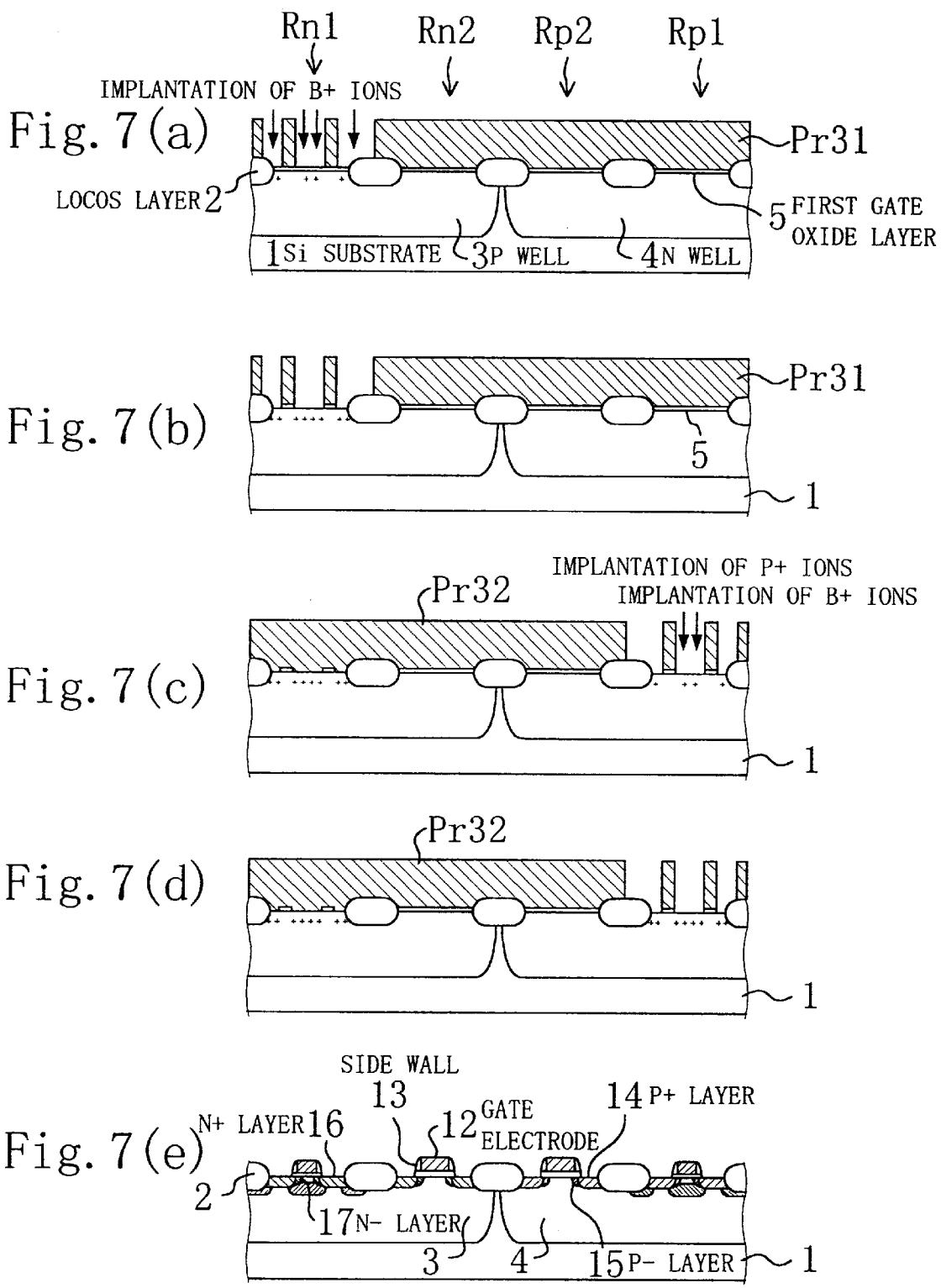

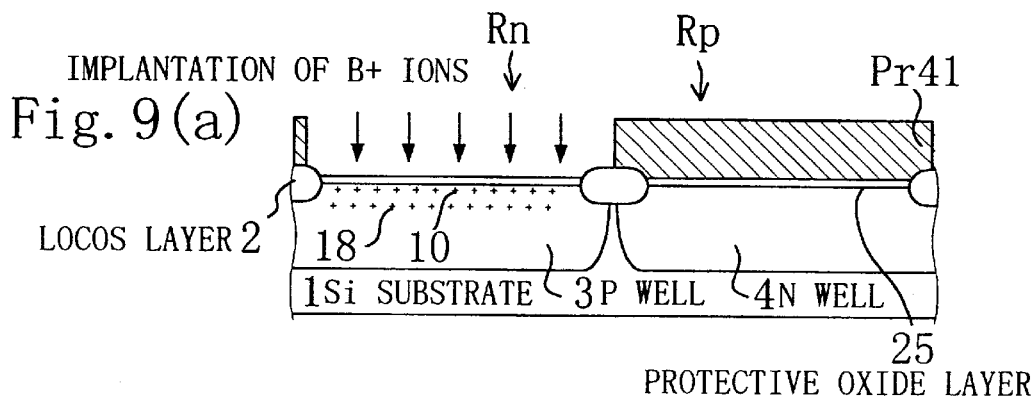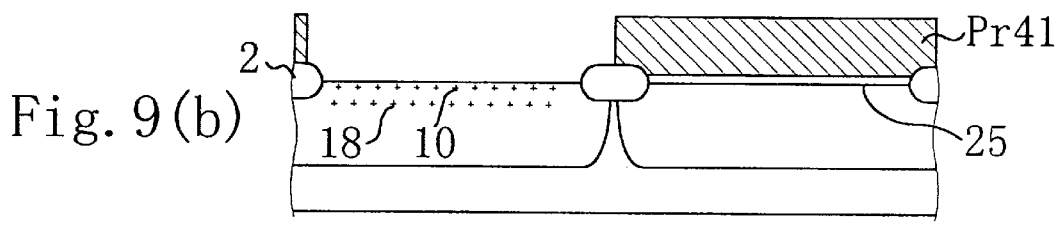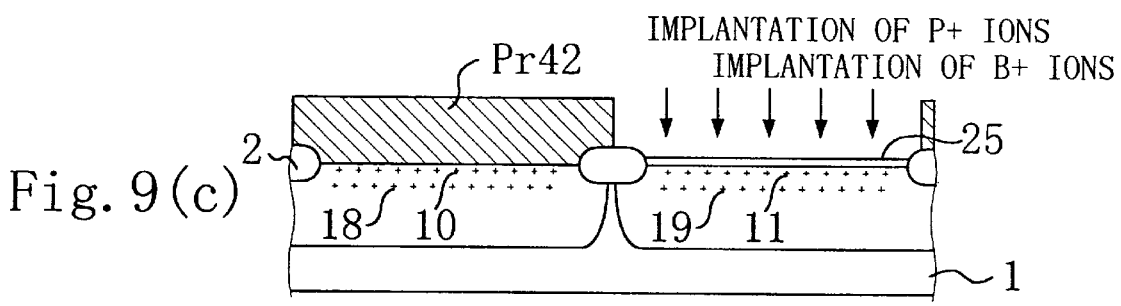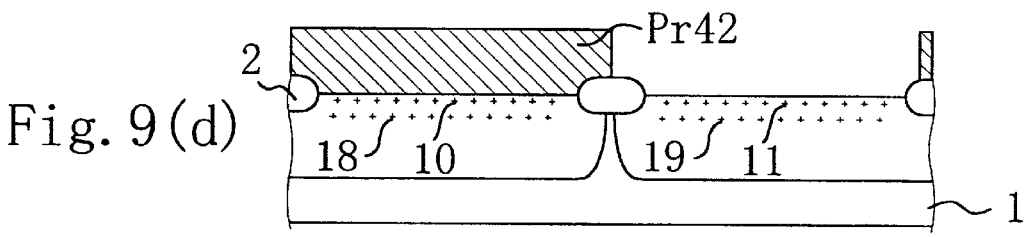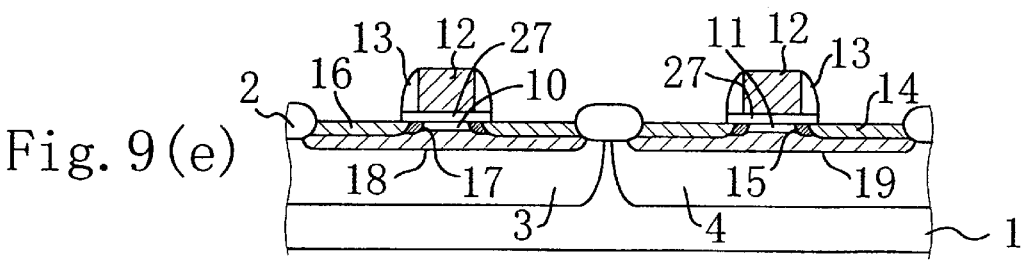

SEMICONDUCTOR DEVICE AND METHOD FOR PRODUCING THE SAME

BACKGROUND OF THE INVENTION

The present invention relates to a semiconductor device functioning as a CMOS device having an NMOSFET and a PMOSFET.

A CMOS device having an NMOSFET and a PMOSFET on the same semiconductor substrate has conventionally been used very frequently as a device constituting a memory or a logic integrated circuit. Generally, a P well and an N well are formed in a region in the vicinity of the surface of a semiconductor substrate and NMOSFET and PMOSFET are respectively formed in the P well and N well. In particular, a so-called retrograde well, in which the peak of impurity concentration is formed deep inside of the semiconductor substrate by ion implantation, is often used recently.

Hereinafter, a retrograde well forming technology as set forth in NIKKEI MICRODEVICES, 1991, December, pp. 110–117 will be described.

FIGS. 11(a) to 11(c) are cross-sectional views illustrating the conventional process steps for producing so-called twin retrograde wells. In FIGS. 11(a) to 11(c), a P-well is to be formed in an NMOSFET forming region Rn and an N-well is to be formed in a PMOSFET forming region Rp.

In the step shown in FIG. 11(a), LOCOS layers 102 for defining the NMOSFET forming region Rn and the PMOSFET forming region Rp are formed on a Si substrate 101. Thereafter, an oxidation process is performed to form a protective oxide layer 125 on the surface of the Si substrate 101. A first resist layer Pr101, which is opened only above the NMOSFET forming region Rn, is also formed. By using the first resist layer Pr101 as a mask, B+ ions are implanted into the NMOSFET forming region Rn for forming a P well 103. By using the first resist layer Pr101 as a mask, B+ ions are also implanted three times for forming an NMOSFET threshold control layer 130, a punch-through stopper 131 and a channel stopper 132. The ion implantation is performed three times while varying implantation energy and implantation amount.

In a step shown in FIG. 11(b), the first resist layer Pr101 is removed, and then a second resist layer Pr102, which is opened above the PMOSFET forming region Rp, is formed. By using the second resist layer Pr102 as a mask, P+ ions are implanted for forming an N well 104. By using the second resist layer Pr102 as a mask, B+ ions are further implanted three times for forming a threshold control layer 133, a punch-through stopper 134 and a channel stopper 135.

In a step shown in FIG. 11(c), the second resist layer Pr102 is removed, and then the entire surface of the Si substrate 101 is etched to remove the protective oxide layer 125.

Although the illustration of the subsequent process steps is omitted, gate oxide layers, gate electrodes, source and drain regions and the like are formed in the NMOSFET forming region Rn and PMOSFET forming region Rp, thereby forming an NMOSFET and a PMOSFET in the respective regions.

However, the above-mentioned conventional method for producing a semiconductor device is disadvantageous in that the properties, such as reliability lifetime, of the gate oxide layers are deteriorated. This is because, when ions are implanted, not only an impurity for generating carriers (i.e., additive impurity), but also an impurity, which adversely affects the properties of the gate oxide layers (hereinafter, such a impurity will be referred to as a "foreign impurity") are introduced into the vicinity of the surface of the oxide layers.

More specifically, when additive impurity ions are implanted by using the first resist layer Pr101 as a mask in the step shown in FIG. 11(a), the foreign impurity is simultaneously implanted into the vicinity of the surface of the protective oxide layer 125 and into the vicinity of the surface of the LOCOS layers 102.

By the time the process step shown in FIG. 11(c) is performed, the foreign impurity, which has been introduced into the protective oxide layer 125 and the LOCOS layers 102 in the step shown in FIG. 11(a), is exposed to high temperature when the first and the second photoresist layers Pr101 and Pr102 are removed. Accordingly, the foreign impurity possibly diffuses inward from the surface of the LOCOS layers 102 or is combined with other impurity to be a compound which cannot be removed even if the protective oxide layer 125 is etched. As a result, when the step shown in FIG. 11(c) is finished, the foreign impurity is residual at any site on the substrate.

If gate oxide layers are formed on the Si substrate 101 by thermal oxidation or the like after the step shown in FIG. 11(c) has been performed, the residual foreign impurity might diffuse or scatter so as to enter the gate oxide layers.

As a result, some defect, such as an impurity level, is caused in the gate oxide layers, thereby presumably deteriorating the properties, such as reliability lifetime, of the gate oxide layers. It has not been researched sufficiently what chemical substance is the foreign impurity and how the foreign impurity is introduced into the gate oxide layers. However, it is already known that such a phenomenon is found remarkable if ion implantation is performed with high energy.

Such a foreign impurity can be removed to a certain degree by means of baking or the like. However, if such a heat treatment is additionally performed, then the number of process steps is undesirably increased. In addition, other problems possibly arise. For example, since the additive impurity is diffused because of the heat applied, a desired impurity profile may not be obtained in some cases.

The above-mentioned deterioration in properties, such as reliability lifetime, of the gate oxide layers caused by the foreign impurity is brought about not only in the step of forming a retrograde well, but also in the steps of forming NMOSFETs and PMOSFETs in the P well and N well which have been formed by diffusion, for example. This is because, in the conventional process generally employed, ion implantation is often performed at high energy in each of the P well and N well with the protective oxide layer deposited, in order to form not only a threshold control layer, but also a punch-through stopper or a channel stopper.

Of the CMOS devices, in a semiconductor device having a thick-layer MOSFET having a thick gate oxide layer for a high voltage (high gate breakdown voltage) and a thin-layer MOSFET having a thin gate oxide layer for a low voltage (low gate breakdown voltage), in particular, if such a device is additionally subjected to a heat treatment such as baking, then the desired electric characteristics cannot be obtained. It is therefore difficult to suppress the deterioration in reliability lifetime of the gate oxide layers owing to the foreign impurity. Also, when the gate oxide layer of the thick-layer MOSFET is used as a protective layer for forming the punch-through stopper of the thin-layer MOSFET, the oxide layer cannot be etched over the entire surface of the wafer. Thus, it is difficult to remove the foreign impurity.

SUMMARY OF THE INVENTION

In view of these points, the present invention has been devised for the purpose of suppressing the deterioration in properties of a gate oxide film, resulting from the foreign impurity introduced when ion implantation for forming an impurity diffusion layer is performed, in a semiconductor device having an NMISFET and a PMISFET and a method for producing such a semiconductor device.

In order to accomplish this object, the present invention provides: means regarding the first method for producing a semiconductor device for a CMOS device; means regarding the second method for producing a semiconductor device for a CMOS device having two types of MOSFETs which are different from each other in the thickness of the gate oxide film thereof; and means regarding a semiconductor device as a CMOS device having two types of MOSFETs which are different from each other in the thickness of the gate oxide film thereof.

The first method for producing a semiconductor device according to the present invention is a method for producing a semiconductor device including a MISFET of a first conductivity type and a MISFET of a second conductivity type. The method includes: a first step of forming, on a substrate having a semiconductor region, an element-isolating insulating layer for dividing said semiconductor region into a first-conductivity-type MISFET forming region and a second-conductivity-type MISFET forming region; a second step of forming a protective insulating layer on a surface of said semiconductor substrate; a third step of forming, on said protective insulating layer, a first resist layer having an opening above at least a part of said first-conductivity-type MISFET forming region; a fourth step of implanting, from above said protective insulating layer, impurity ions into said semiconductor substrate at least once by using said first resist layer as a mask; a fifth step of performing etching by using said first resist layer as a mask, until a portion of said protective insulating layer, which is exposed through said opening of said first resist layer, is removed; a sixth step of removing said first resist layer; a seventh step of forming, on said substrate, a second resist layer having an opening above said second-conductivity-type MISFET forming region, after the sixth step has been performed; an eighth step of implanting, from above said protective insulating layer, impurity ions into said semiconductor substrate at least once by using said second resist layer as a mask; a ninth step of performing etching by using said second resist layer as a mask, until a portion of said protective insulating layer, which is exposed through said opening of said second resist layer, is removed; and a tenth step of removing said second resist layer after the ninth step has been performed.

According to this method, a foreign impurity is also introduced into the protective insulating layer and the element-isolating insulating layers when impurity ions are implanted in each of the fourth and the eighth steps. However, in each of the fifth and the ninth steps, etching is performed to remove a portion of the protective insulating layer exposed through the opening of the first resist layer. At this time, the portions in the vicinity of the surface of element-isolating insulating layers are also removed by etching, thereby removing the foreign impurity, introduced into the protective insulating layer and element-isolating insulating layers, before the foreign impurity diffuses the surrounding regions. Accordingly, even though a gate insulating layer is formed later, there is no possibility of the foreign impurity entering the gate insulating layer. This prevents various properties, such as reliability lifetime, of the gate insulating layer from being deteriorated. Further, since a step of removing the foreign impurity is not particularly required, the number of production steps is not increased and the production process is not complicated.

In the first method for producing a semiconductor device, at least one of the fourth and the eighth steps of implanting impurity ions may include implanting impurity ions for forming a well.

According to this method, it is possible to prevent the foreign impurity, introduced at the time of implantation of impurity ions for forming a so-called retrograde well, from being entering the gate insulating layer, thereby preventing the properties of the gate insulating layer from being deteriorated.

In the first method for producing a semiconductor device, at least one of the fourth and the eighth steps of implanting impurity ions may include implanting impurity ions for controlling a threshold value.

In the first method for producing a semiconductor device, at least one of the fourth and the eighth steps of implanting impurity ions may include implanting impurity ions for forming a punch-through stopper.

In the first method for producing a semiconductor device, at least one of the fourth and the eighth steps of implanting impurity ions may include implanting impurity ions for forming a channel stopper.

The first method for producing a semiconductor device may further include a step of forming a gate insulating layer on said semiconductor substrate after the tenth step has been performed.

The second method for producing a semiconductor device of the present invention is a method for producing a semiconductor device including: a low-voltage MISFET of a first conductivity type; a low-voltage MISFET of a second conductivity type; a high-voltage MISFET of the first conductivity type; and a high-voltage MISFET of the second conductivity type. The method includes: a first step of forming, on a substrate having a semiconductor region, element-isolating insulating layers for dividing the semiconductor region into a low-voltage first-conductivity-type MISFET forming region, a low-voltage second-conductivity-type MISFET forming region, a high-voltage first-conductivity-type MISFET forming region, and a high-voltage second-conductivity-type MISFET forming region; a second step of forming a first gate insulating layer on a surface of the semiconductor substrate; a third step of forming, on the first gate insulating layer, a first resist layer having an opening above a region including at least a portion of the channel region of the low-voltage first-conductivity-type MISFET forming region; a fourth step of implanting, from above the first gate insulating layer, impurity ions into the semiconductor substrate at least once by using the first resist layer as a mask; a fifth step of performing etching by using the first resist layer as a mask, until a portion of the first gate insulating layer, which is exposed through the opening of the first resist layer, is removed; a sixth step of removing the first resist layer; a seventh step of forming, on the semiconductor substrate, a second resist layer having an opening above a region including at least a portion of the channel region of the low-voltage second-conductivity-type MISFET forming region; an eighth step of implanting, from above the first gate insulating layer, impurity ions into the semiconductor substrate at least once by using the second resist layer as a mask; a ninth step of performing etching by using the second resist layer as a mask, until a portion of said first gate insulating layer, which is exposed through the opening of the second resist layer, is removed; a tenth step of removing the second resist layer and then forming a second gate insulating layer on the substrate; an eleventh step of forming a gate electrode on each said gate insulating layer of each said MISFET forming region; and a twelfth step of forming a source region and a drain region, respectively, in a pair of regions which sandwich each said gate electrode in each said MISFET forming region.

In the same way as the first method for producing a semiconductor device, in the second method for producing a semiconductor device, it is also possible to prevent the foreign impurity, introduced in the fourth and the eighth steps, from entering the gate insulating layer. The foreign impurity is also introduced into the gate insulating layer and the element-isolating insulating layers when impurity ions are implanted in each of the fourth and the eighth steps. However, in each of the fifth and the ninth steps, etching is performed to remove a portion of the first gate insulating layer exposed through the opening of the first or the second resist layer. At this time, the portions in the vicinity of the surfaces of element-isolating insulating layers are also removed by etching, thereby removing the foreign impurity introduced into the first gate insulating layer and element-isolating insulating layers, before the foreign impurity diffuses the surrounding regions. Accordingly, even though a second gate insulating layer is formed later, there is no possibility of the foreign impurity diffusing to enter the second gate insulating layer. Furthermore, no foreign impurity diffuses and enters the first gate insulating layer remaining in each of the high-voltage MISFETs. When the final step is completed, the gate insulating layer of each of the low-voltage MISFETs is formed of only the second gate insulating layer and the gate insulating layer of each of the high-voltage MISFETs is formed of the first and the second gate insulating layers. As a result, two types of the gate insulating layers, which are different from each other in thickness are formed. This prevents the foreign impurity from entering the gate insulating layer of any of the MISFETs. Consequently, a semiconductor device having improved characteristics, such as reliability lifetime, can be produced.

In particular, in a semiconductor device having low-voltage MISFETs and high-voltage MISFETs, when foreign impurity diffuses in the first gate insulating layer in each high-voltage MISFET forming region, it becomes difficult to remove the foreign impurity from the first gate insulating layer later by baking or the like because the second gate insulating layer is formed on the first gate insulating layer. However, the second method of the present invention prevents the foreign impurity from diffusing to enter the first gate insulating layer in the high-voltage MISFET forming region. Thus, the properties of the gate insulating layer can be remarkably improved.

In the second method for producing a semiconductor device, the opening of at least one of the first and the second resist layers may be open only above the gate electrode forming region.

According to this method, when the step of forming the second gate insulating layer is completed, a thick gate insulating layer, in which the second gate insulating layer is stacked on the first gate insulating layer, i.e., a gate insulating layer having an equal thickness to that of the gate insulating layer on each of the high-voltage MISFET forming regions, can be obtained on both sides of the gate electrode in each of the low-voltage MISFET forming regions. Accordingly, when the gate insulating layer on both sides of the gate electrode is removed in each MISFET forming region, the amount of over-etching can be remarkably reduced in each low-voltage MISFET forming region. As a result, the reduction in thickness of the element-isolating insulating layers can be lightened. Thus, it is possible to form a semiconductor device, including low-voltage MISFETs excellent in element isolation function, in which ends of the element-isolating insulating layers are lowered due to the reduction in thickness thereof, the source and the drain diffusion layers do not extend under the element-isolating insulating layers, and the short-channel effect and junction leakage are small.

In the second method for producing a semiconductor device, the opening of at least one of the first and the second resist layers may include ends of the element-isolating insulating layers and the source and the drain regions of the corresponding low-voltage first- or second-conductivity-type MISFET.

According to this method, an impurity diffusion layer serving either as a punch-through stopper or a channel stopper can be formed by performing the first or the second step of implanting ions into a low-voltage MISFET forming region.

In the second method for producing a semiconductor device, the opening of at least one of the first and the second resist layers may be open only above ends of the element-isolating insulating layers and the channel region of the corresponding low-voltage first- or second-conductivity-type MISFET.

According to this method, even when additive impurity ions are implanted into the semiconductor device region in either ion implantation step, no impurity diffusion layer exists under the source and the drain regions. Thus, it is possible to obtain a semiconductor device having MISFETs in which the junction breakdown voltage is not decreased and the junction capacitance is not increased even when a p-n junction is formed around the lower ends of the source and the drain regions.

In the second method for producing a semiconductor device, at least one of the fourth and the eighth steps of implanting impurity ions preferably includes: a first step of implanting impurity ions for controlling a threshold voltage; and a second step of implanting impurity ions at least once at implantation energy higher than energy in the first step.

According to this method, a threshold voltage can be controlled and a punch-through stopper, a channel stopper, a well and the like can be formed by using a common resist layer, in either or both of low-voltage first-conductivity-type MISFET forming regions and second-conductivity-type MISFET forming regions. Thus, a semiconductor device, which includes two types of NMISFETs having respectively different gate breakdown voltages and two types of PMISFETs having respectively different gate breakdown voltages and which has MISFETs having a variety of functions, can be obtained by performing simplified process steps. The second method for producing a semiconductor device is particularly advantageous in that isolation function can be enhanced and the short-channel effect can be suppressed for a low-voltage MISFET for which a higher density is required.

In the second method for producing a semiconductor device, the first conductivity type may be an N type and the second conductivity type may be a P type. P-type impurity ions may be implanted twice in the fourth step with respectively different acceleration energy and doses, and N-type impurity ions may be implanted once and P-type impurity ions may be implanted once in the eighth step.

According to this method, a threshold voltage can be regulated and at least an impurity diffusion layer functioning as a punch-through stopper can be formed by implanting P-type impurity ions twice in the low-voltage NMISFET forming region. On the other hand, in the low-voltage PMOSFET forming region, the threshold voltage can be regulated by implanting P-type impurity ions and a punch-through stopper, a channel stopper, a well and the like can be formed by implanting N-type impurity ions.

The semiconductor device of the present invention includes, on a substrate having a semiconductor region: a low-voltage MISFET of a first conductivity type; a low-voltage MISFET of a second conductivity type; a high-voltage MISFET of the first conductivity type; and a high-voltage MISFET of the second conductivity type. Each of the MISFETs includes: a gate insulating layer formed on the semiconductor region; a gate electrode formed on the gate insulating layer; and a source region and a drain region which have been formed by introducing an impurity into a pair of regions within the semiconductor region, the pair of regions sandwiching the gate electrode. In at least one of the low-voltage MISFET of the first conductivity type and the low-voltage MISFET of the second conductivity type, the gate insulating layer below the gate electrode is thicker in at least one end of the gate insulating layer than in a center of the gate insulating layer.

This makes it possible to suppress GIDL in a low-voltage MISFET for a semiconductor device.

In the semiconductor device, an impurity diffusion layer of a conductivity type opposite to the conductivity type of the MISFET, including the stepped gate insulating layer, may be formed at a position deeper than a lower end of the gate insulating layer in at least a center of a region under a gate of the MISFET.

Since an impurity diffusion layer functioning as a punch-through stopper exists in this configuration, it is possible to obtain a MISFET, which can suppress the short-channel effect very satisfactorily.

BRIEF DESCRIPTION OF THE DRAWINGS

FIGS. 1(a) to 1(c) are cross-sectional views of a method for producing a semiconductor device in the first embodiment of the present invention, illustrating steps preceding the step of implanting impurity ions into a PMOSFET forming region.

FIGS. 7(a) to 7(e) are cross-sectional views illustrating the main steps of a method for producing a semiconductor device in the third embodiment.

FIGS. 9(a) to 9(e) are cross-sectional views illustrating the main steps of a method for producing a semiconductor device in the fourth embodiment.

FIGS. 10(a) to 10(d) are cross-sectional views of a method for producing a semiconductor device in the fifth embodiment, illustrating the main steps of forming retrograde wells and the like.

FIGS. 11(a) to 11(c) are cross-sectional views of a conventional method for producing a semiconductor device, illustrating the main steps of forming retrograde wells and the like.

DETAILED DESCRIPTION OF THE INVENTION

Embodiment 1

Figure 2A:
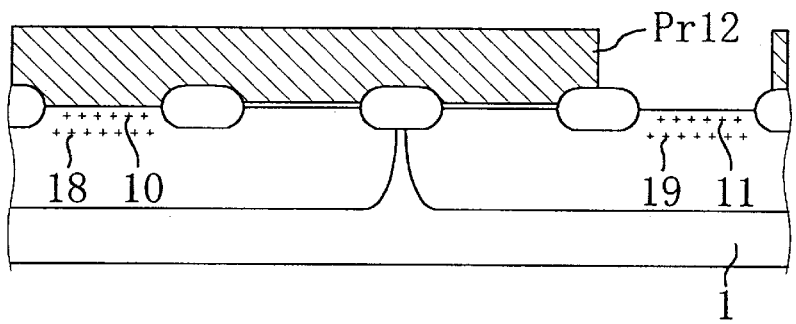
FIGS. 2(a) to 2(c) are cross-sectional views of the method for producing a semiconductor device in the first embodiment, illustrating a step of removing the gate oxide layer from the PMOSFET forming region and the succeeding steps thereof.

Hereinafter, a method for producing a semiconductor device in the first embodiment will be described with reference to FIGS. 1(a) to 1(c), FIGS. 2(a) to 2(c) and FIG. 3.

FIGS. 1(a) to 1(c) and FIGS. 2(a) to 2(c) are cross-sectional views illustrating the method for producing a semiconductor device in the first embodiment. FIG. 3 is a cross-sectional view illustrating the structure of only the thin-layer NMOSFET formed by the method for producing a semiconductor device in the first embodiment. In FIGS. 1(a) to 1(c), FIGS. 2(a) to 2(c) and FIG. 3, a Si substrate 1, LOCOS layers 2, a P well 3, an N well 4, a first gate oxide layer 5, a second gate oxide layer 7, a third gate oxide layer 8, a first and a second resist layer Pr11, Pr12, gate electrodes 12, side walls 13, P+ layers 14, P− layers 15, N+ layers 16, N− layers 17 and a P− layer 18 are shown.

In a step shown in FIG. 1(a), the P well 3, the N well 4 and the LOCOS layers 2 are formed on the Si substrate 1. In this step, the P well 3 is divided into a low-voltage NMOSFET forming region Rn1 (region in which an NMOSFET having a thin gate oxide layer is to be formed) and a high-voltage NMOSFET forming region Rn2 (region in which an NMOSFET having a thick gate oxide layer is to be formed), and the N well 4 is divided into a low-voltage PMOSFET forming region Rp1 (region in which a PMOSFET having a thin gate oxide layer is to be formed) and a high-voltage PMOSFET forming region Rp2 (region in which a PMOSFET having a thick gate oxide layer is to be formed). Then, a first gate oxidation process is performed to form the first gate oxide layers 5 on the surface of the Si substrate 1. Then, the first resist layer Pr11, which is opened only above the low-voltage NMOSFET forming region Rn1, is formed. By using this first resist layer Pr11 as a mask, B+ ions are implanted twice into the low-voltage NMOSFET forming region Rn1 for forming a threshold control layer 10 functioning as a channel region of the thin-layer NMOSFET and for forming the P− layer 18 functioning as a punch-through stopper or a channel stopper. The ion implantation is performed twice while varying the implantation energy and implantation amount. During this step, a foreign impurity, adversely affecting the properties of the gate oxide layers or the like, is also introduced into the oxide layer.

In a step shown in FIG. 1(b), by using the first resist layer Pr11 as a mask, etching is performed to remove the first gate oxide layer 5 and portions of the LOCOS layers 2 in the vicinity of the surface thereof in the low-voltage NMOSFET forming region Rn1. By performing this process step, the foreign impurity, existing in the first gate oxide layer 5 and in the vicinity of the surface of the LOCOS layers 2, is removed from the low-voltage NMOSFET forming region Rn1, before the foreign impurity diffuses the surrounding regions.

In a step shown in FIG. 1(c), the first resist layer Pr11 is removed and then the second resist layer Pr12, which is opened above the low-voltage PMOSFET forming region Rp1, is formed. By using the second resist layer Pr12 as a mask, B+ ions are implanted twice for forming a threshold control layer 11 and for forming an N– layer 19 functioning as a punch-through stopper or channel stopper. During this step, a foreign impurity, adversely affecting the properties of the gate oxide layers or the like, is also introduced into the oxide layer.

Figure 3:
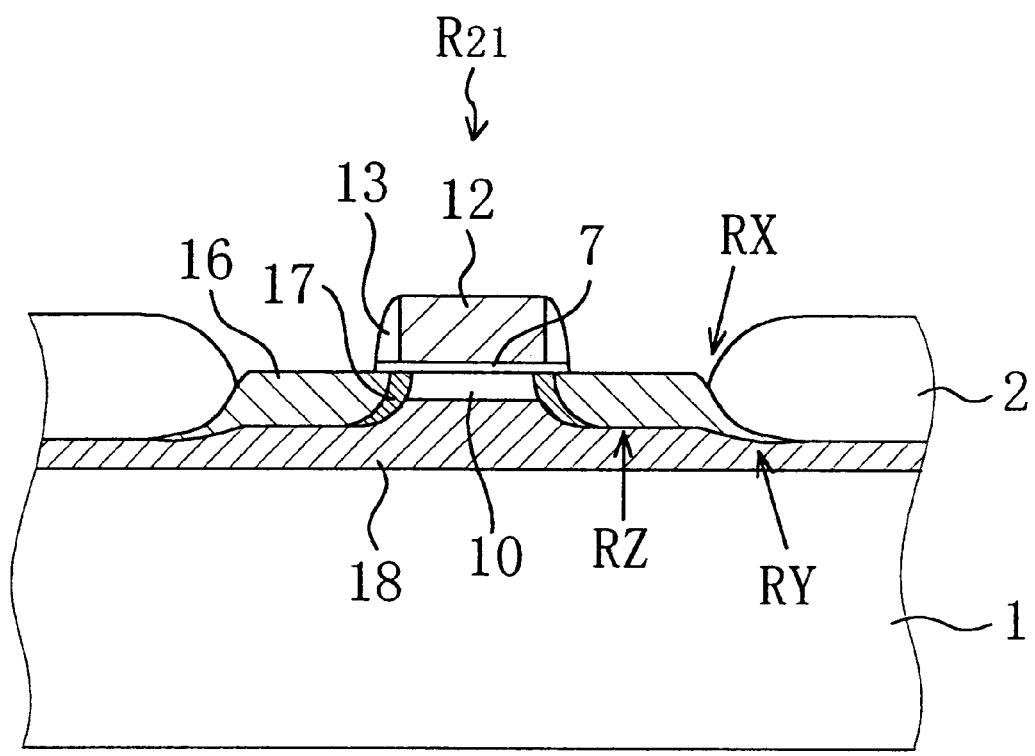
FIG. 3 is a cross-sectional view of a thin-layer NMOSFET formed by the method for producing a semiconductor device in the first embodiment.

In a step shown in FIG. 2(a), by using the second resist layer Pr12 as a mask, etching is performed to remove the first gate oxide layer 5 from the low-voltage PMOSFET forming region Rp1. By performing this process step, the foreign impurity, existing in the first gate oxide layer 5 and in the vicinity of the surface of the LOCOS layers 2, is removed from the low-voltage PMOSFET forming region Rp1, before the foreign impurity diffuses the surrounding regions.

Figure 2B:
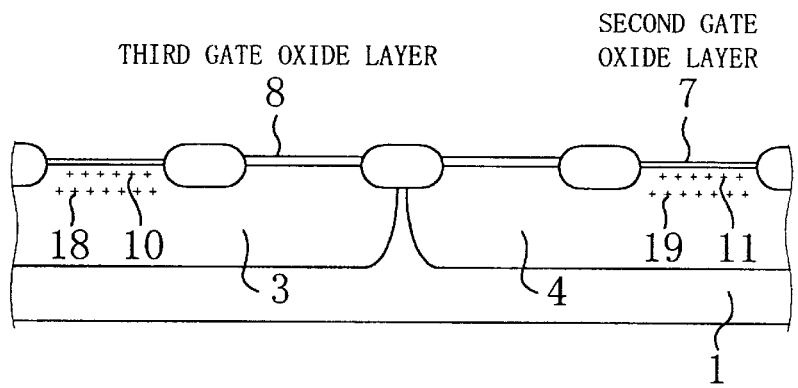

In a step shown in FIG. 2(b), the second resist layer Pr12 is removed and the Si substrate 1 is then subjected twice to a gate oxidation process. In the first gate oxidation step, the second thin gate oxide layers 7 are formed in the low-voltage NMOSFET forming region Rn1 and in the low-voltage PMOSFET forming region Rp1, and in the second gate oxidation step, the third thick gate oxide layers 8 are formed in the high-voltage NMOSFET forming region Rn2 and in the high-voltage PMOSFET forming region Rp2.

Figure 2C:
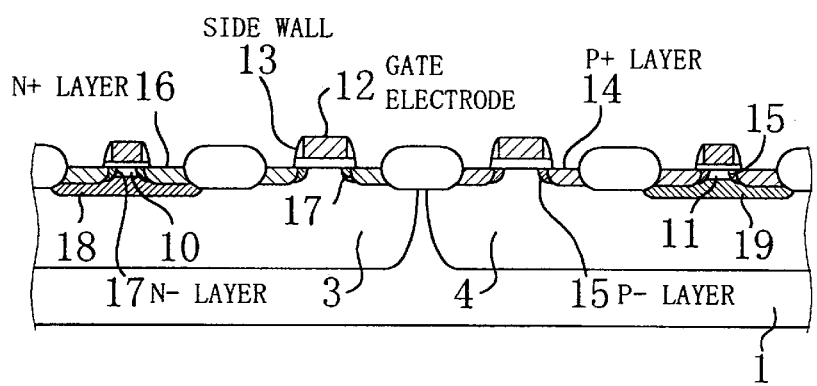

In a step shown in FIG. 2(c), a gate electrode 12 is formed in each of the regions Rn1, Rn2, Rp1 and Rp2, and the N– layers 17 functioning as NMOSFET LDDs (low-concentration source and drain regions) and the P– layers 15 functioning as PMOSFET LDDs are also formed. Then, the sidewalls 13 are formed on the sides of each gate electrode 12. During this step, gate oxide layers 7, 8 in the vicinity of the gate electrodes 12 are also removed.

Then, the N+ layers 16 respectively functioning as the source and the drain regions for the NMOSFET are formed in the NMOSFET forming regions Rn1, Rn2, respectively, and the P+ layers 14 respectively functioning as the source and the drain regions for the PMOSFET are formed in the PMOSFET forming regions Rp1, Rp2, respectively.

FIG. 3 is a cross-sectional view illustrating only the thin-layer NMOSFET of the semiconductor device formed by the method for producing a semiconductor device.

In the step shown in FIG. 1(a), by implanting B+ ions at acceleration energy of about 100 keV, for example, the P– layer 18 having a peak of impurity concentration at a deep position below the gate oxide layer 7 can be formed. More specifically, the P– layer 18 functions as a channel stopper for suppressing the short-channel effect of the thin-layer NMOSFET. In the step shown in FIG. 1(a), by implanting B+ ions at acceleration energy of about 150 keV, for example, the P– layer 18 having a peak of impurity concentration at a deep position below the lower ends of the LOCOS layers 2 can also be formed. More specifically, the P– layer 18 functions as a channel stopper for enhancing the isolation function of the LOCOS layers 2. By using the first resist layer Pr11 as a mask, the ion implantation is performed three times at three different acceleration energy values to form a threshold control layer, a punch-through stopper and a channel stopper.

As to the thin-layer PMOSFET formed in the low-voltage PMOSFET forming region Rp1, when P+ ions are implanted in the step shown in FIG. 1(c) at acceleration energy of about 150 keV, for example, the N– layer 19 thus formed functions as a punch-through stopper for suppressing the short-channel effect of the thin-layer PMOSFET. When this ion implantation is performed with acceleration energy of about 300 keV, for example, the N– layer 19 thus formed functions as a channel stopper for enhancing the isolation function of the LOCOS layers 2. By using the second resist layer Pr12 as a mask, the ion implantation is performed three times at three different acceleration energy values to form a threshold control layer, a punch-through stopper and a channel stopper.

According to the method for producing a semiconductor device of the first embodiment, the thin-layer NMOSFET, the thin-layer PMOSFET, the thick-layer NMOSFET and the thick-layer PMOSFET are formed on the same semiconductor substrate, while precisely regulating the threshold voltages of the MOSFETs. Furthermore, it is possible to optimize the ion implantation condition for forming each of the channel stopper and the punch-through stopper. Thus, each of the channel stopper and the punch-through stopper can be formed at a more suitable position. This not only suppresses the short-channel effect but also isolates adjacent regions Rn1, Rn2, Rp1, Rp2 more satisfactorily.

In accordance with the method of the first embodiment, a semiconductor device having satisfactory gate oxide layers can be obtained based on the function set forth below.

In the step shown in FIG. 1(a), by using the first resist layer Pr11 as a mask, B+ ions are implanted twice into the low-voltage NMOSFET forming region Rn1 for forming the threshold control layer 10 and for forming the punch-through stopper or channel stopper. During this process step, not only the B+ ions but also a foreign impurity, adversely affecting the properties of the gate oxide layers and the like, are introduced. Particularly, if ions are implanted at high energy, a noticeable amount of foreign impurity is introduced. However, immediately after the step in FIG. 1(a) has been performed, etching is performed to remove the first gate oxide layer 5 in the step shown in FIG. 1(b). As a result, the foreign impurity existing in the first gate oxide layer 5 and in the vicinity of surface of the LOCOS layers 2 is also removed from the low-voltage NMOSFET forming region Rn1 before the foreign impurity diffuses the surrounding regions. Thus, it is possible to prevent, with certainty, the foreign impurity, introduced at the time of ion implantation, from diffusing the surrounding regions, unlike the conventional method for producing a semiconductor device. Furthermore, even though foreign impurity is introduced in the step shown in FIG. 1(c), the foreign impurity can immediately be removed in the step shown in FIG. 2(a). Accordingly, no foreign impurity is contained in the first gate oxide layer 5 remaining in each of the high-voltage MOSFET forming regions Rn2, Rp2. Even though the second gate oxide layers 7 are formed in the step shown in FIG. 2(b), there is no possibility of foreign impurity scattering into the second gate oxide layers 7 from portions of the LOCOS layers 2. As a result, in each of the low-voltage NMOSFET, the low-voltage PMOSFET, the high-voltage NMOSFET and the high-voltage PMOSFET, it is possible to obtain a satisfactory gate oxide layer in which the foreign impurity, which has been introduced simultaneously with implanted impurity ions, is not diffusing.

Figure 4A:
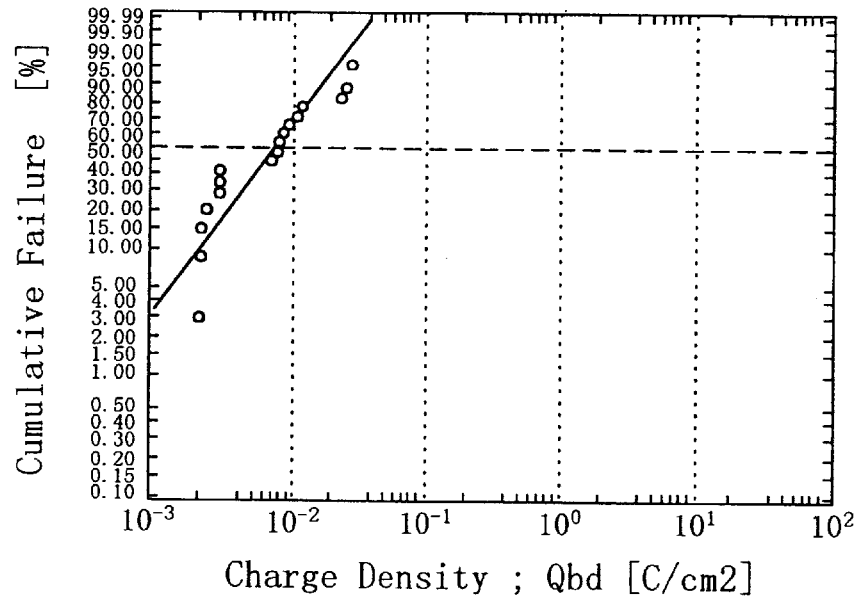
FIGS. 4(a) and (b) are graphs illustrating data about quality of the gate oxide layer formed by a conventional method and the gate oxide layer formed by the method in the first embodiment of the present invention.
Figure 4B:
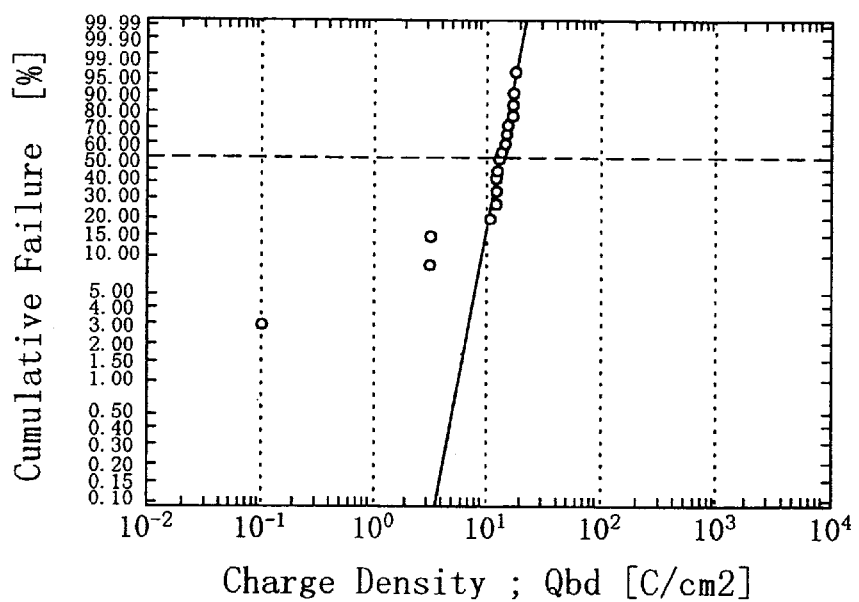

FIGS. 4(a) and 4(b) are graphs illustrating the data about breakdown electric-charge amount Qbd obtained through TDDB tests performed on the gate oxide layer of a semiconductor device formed by a conventional method and on the gate oxide layer of a semiconductor device formed by the method in the first embodiment of the present invention. Setting an electric current value at −20 mA/cm$^{-2}$, a constant-current test was performed on each test sample of an array having 30,000 transistors, each having a gate oxide layer having a thickness of 9 nm, a length of 0.4 μm and a width of 10 μm. As can be understood from FIGS. 4(a) and 4(b), the breakdown electric-charge amount Qbd, i.e., dielectric strength, of the gate oxide layer according to the present invention is improved, on average, by about two orders of magnitude, as compared with that of the conventional semiconductor device.

More specifically, when the gate oxide layer is removed and a resist layer is formed directly on the Si substrate 1 as shown in FIG. 1(c), the inside of the Si substrate 1 is contaminated. Thus, the quality of the gate oxide layer is possibly affected adversely. Therefore, in prior art, such a step of forming a resist layer directly on the Si substrate has been avoided. However, the following fact was discovered by the tests performed in the process of the present invention. When a resist layer was formed directly on the Si substrate without being interposed by a gate oxide layer or the like, the Si substrate might be contaminated and a gate oxide layer subsequently formed on the Si substrate might also be contaminated to a certain extent. It was confirmed, however, that the deterioration in quality of the gate oxide layer resulting from such a contamination was negligible, as compared with the deterioration in quality of the gate oxide layer resulting from the diffusion of the foreign impurity introduced owing to the ions implanted from above the gate oxide layer.

In the first embodiment, after the step shown in FIG. 1(b) has been performed, the first resist layer Pr11 is removed and then the second resist layer Pr12 is formed. However, a gate oxidation step may be inserted after the first resist layer Pr11 has been removed. If the gate oxidation step is inserted, then the gate oxide layer of the thin-layer NMOSFET in the low-voltage NMOSFET forming region Rn1 can have a different thickness from that of the gate oxide layer of the thin-layer PMOSFET in the low-voltage PMOSFET forming region Rp1. Thus, not only a semiconductor device having two types of gate oxide layers, but also a semiconductor device having three or more types of gate oxide layers can be formed.

Embodiment 2

Hereinafter, a method for producing a semiconductor device of the second embodiment will be described. FIGS. 5(a) to 5(f) are cross-sectional views illustrating the steps of a method for producing a semiconductor device in the second embodiment. FIGS. 6(a) and 6(b) are cross-sectional views of a thin-layer NMOSFET produced according to the method for producing a semiconductor device of the second embodiment.

Figure 5A:
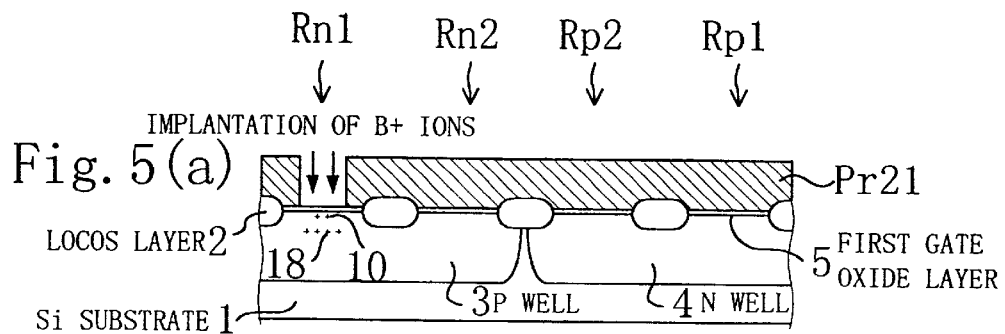
FIGS. 5(a) to 5(f) are cross-sectional views illustrating the main steps of a method for producing a semiconductor device in the second embodiment.
Figure 5B:
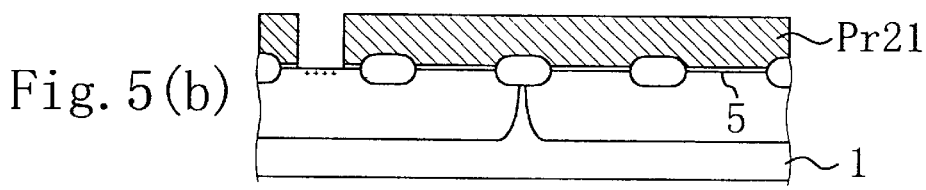
Figure 5C:
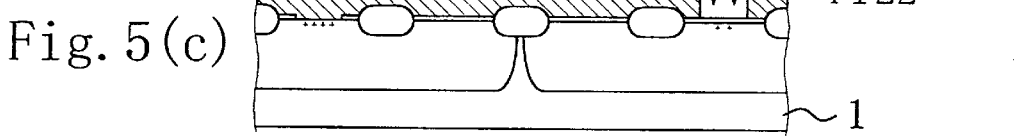

The steps shown in FIGS. 5(a) to 5(f) are basically identical with the steps shown in FIGS. 1(a) to 1(c) in the first embodiment, except for the following points. The second embodiment differs from the first embodiment in that each of a first resist layer Pr21 used in a step shown in FIG. 5(a) and a second resist layer Pr22 used in a step shown in FIG. 5(b), is not opened entirely over a MOSFET forming region, but is opened only above a portion of a MOSFET forming region in which a MOSFET threshold control layer is to be formed. Thus, the second embodiment differs from the first embodiment in the following points in subsequent steps.

In a step shown in FIG. 5(a), B+ ions for forming a threshold control layer 10 are implanted only into the vicinity of a portion, to be a channel region, in the low-voltage NMOSFET forming region Rn1, and B+ ions forming a P− layer 18 functioning as a punch-through stopper are implanted only below the threshold control layer 10.

In a step shown in FIG. 5(b), only the first gate oxide layer 5, which is located above the threshold control layer 10, is removed from the low-voltage NMOSFET forming region Rn1.

In a step shown in FIG. 5(c), B+ ions for forming a threshold control layer 11 are implanted only into the vicinity of a portion, to be a channel region, in the low-voltage PMOSFET forming region Rp1, and P+ ions for forming an N− layer 19 functioning as a punch-through stopper are implanted only below the threshold control layer 11.

Figure 5D:
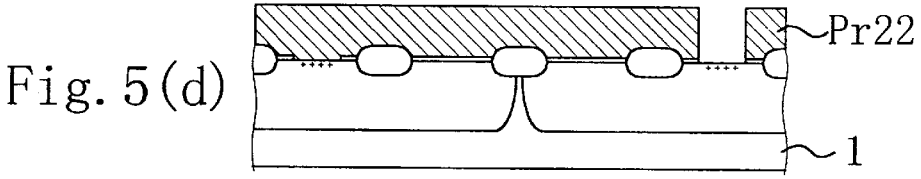
Figure 6A:
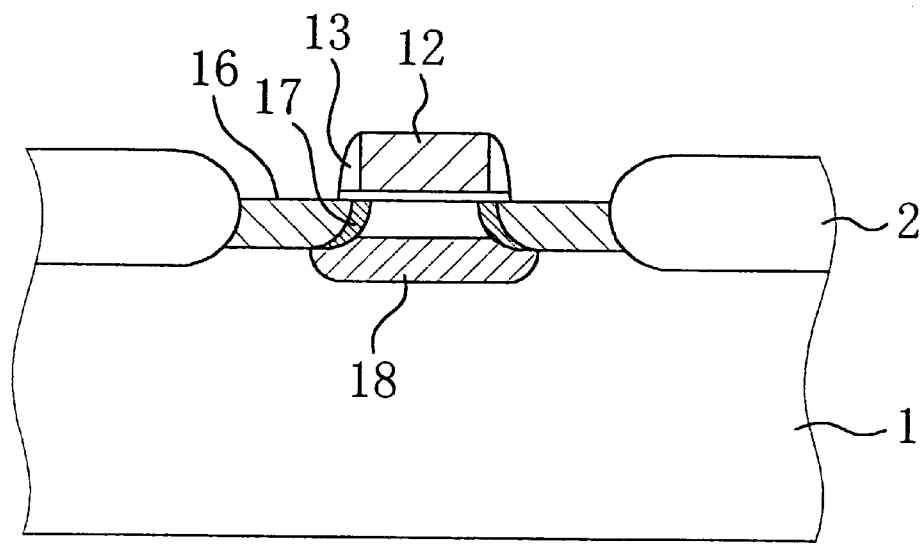
FIGS. 6(a) and 6(b) are cross-sectional views of a thin-layer NMOSFET formed by the method for producing a semiconductor device in the second embodiment.
Figure 6B:
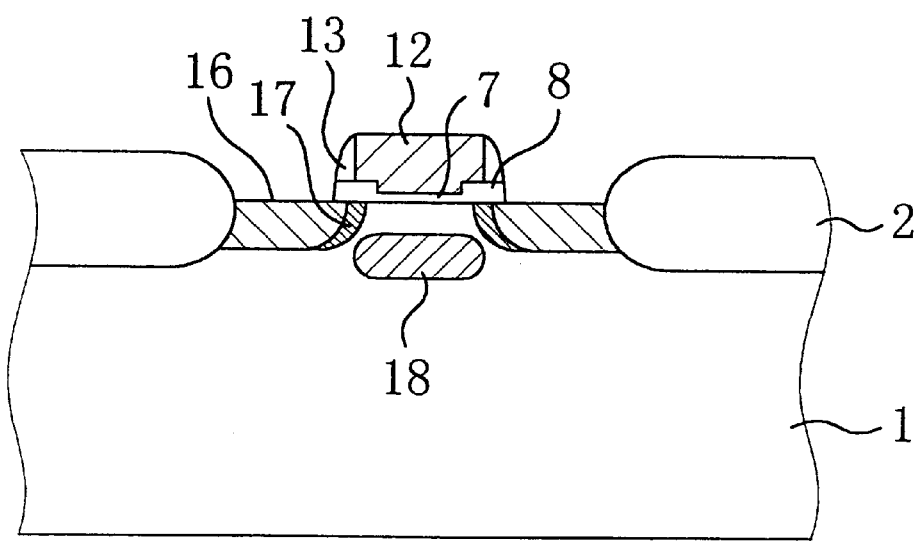

In a step shown in FIG. 5(d), only the first gate oxide layer 5, which is located above the threshold control layer 11, is removed from the low-voltage PMOSFET forming region Rp1.

Figure 5E:
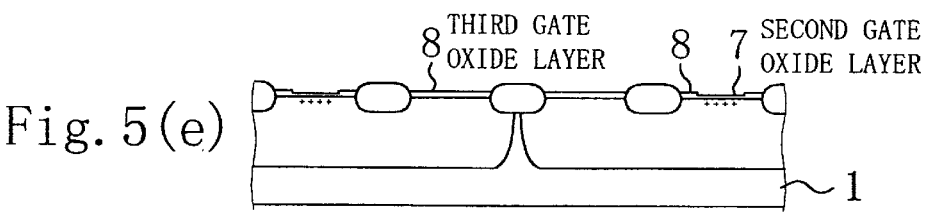

In a step shown in FIG. 5(e), a second thin gate oxide layer 7 is formed on each of the threshold control layers 10, 11 and a third thick gate oxide layer 8 is formed on both sides of each of the threshold control layers 10, 11 in the low-voltage NMOSFET forming region Rn1 and the low-voltage PMOSFET forming region Rp1.

Figure 5F:
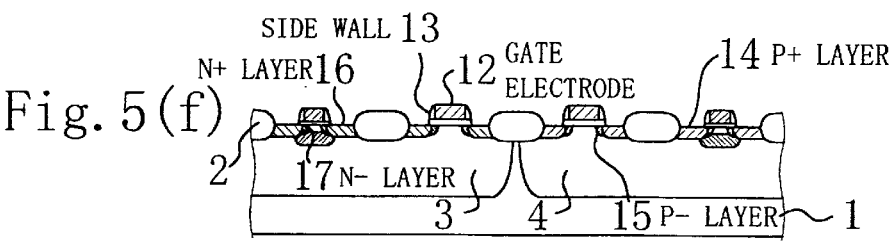

In a step shown in FIG. 5(f), an oxide layer is deposited and anisotropic etching is performed in order to form sidewalls. The second embodiment is different from the first embodiment in that the LOCOS layers 2 are not etched. In each of the regions Rn1, Rn2, Rp2, Rp1, the LOCOS layers 2 on both sides of each gate electrode 12 have an equal thickness. This equalizes the etching progress states in the regions Rn1, Rn2, Rp2, Rp1.

More specifically, the LOCOS layers 2 are not etched when the first gate oxide layer 5 is removed from each of the low-voltage NMOSFET forming region Rn1 and the low-voltage PMOSFET forming region Rp1. Accordingly, even though the Si substrate 1 is then etched for removing the third gate oxide layer 8 from each of the high-voltage NMOSFET forming region Rn2 and the high-voltage PMOSFET forming region Rp2, the thickness of the LOCOS layers 2 is not remarkably reduced as compared with in the first embodiment. That is to say, since the amount of over-etching may be small in each region, it is possible to prevent the thickness of the LOCOS layers 2 from being considerably reduced.

FIGS. 6(a) and 6(b) are cross-sectional views each illustrating the structure of a thin-layer NMOSFET formed through the steps shown in FIGS. 5(a) to 5(f). FIG. 6(a) shows an NMOSFET formed by using a first resist layer Pr21 having an opening larger in area than the gate electrode 12 in the step shown in FIG. 5(a), while FIG. 6(b) shows an NMOSFET formed by using a first resist layer Pr21 having an opening smaller in area than the gate electrode 12 in the step shown in FIG. 5(a). A thin-layer PMOSFET having a similar structure to that shown in each of FIG. 6(a) and FIG. 6(b) can also be obtained.

The method for producing a semiconductor device in the second embodiment can attain the following effects, in addition to the effects attained by the first embodiment.

In the step shown in FIG. 5(f), the reduction in thickness of the LOCOS layers 2 can be lightened in each of the MOSFET forming regions Rn1, Rn2, Rp2, Rp1. As a result, the ends of the LOCOS layer 2 are hardly removed owing to reduction in thickness as shown in a region Rx in FIG. 3. Accordingly, when high-concentration impurity ions are implanted for forming the source and drain regions, it is possible to prevent the source and the drain regions (N+ layers 16) from extending under the LOCOS layers 2 to generate junction leakage, as shown in a region Ry in FIG. 3. In particular, in a method using a salicide process, the portions in the vicinity of the surface of the source and drain regions are silicidized. During this process, if the ends of the LOCOS layers have been deeply removed, then the silicidation possibly proceeds under the LOCOS layers to generate short-circuiting electric current between adjacent MOSFETS. Also, the leakage between the source/drain regions and the substrate region is possibly increased. The semiconductor device of the second embodiment can effectively prevent such inconveniences.

As shown in FIGS. 6(a) and 6(b), in each of the thin-layer NMOSFET and thin-layer PMOSFET of the second embodiment, the P− layer 18 is not formed in the entire region under the N+ layers 16 functioning as the source/drain regions. That is to say, under the N+ layers 16, a well containing a lower-concentration impurity is formed. Accordingly, since a PN junction, which is otherwise generated in a region Rz between the N+ layers 16 and the P− layer 18 and which contains an impurity having a concentration higher than the impurity concentration of the well, does not exist, it is possible to suppress a reduction in junction breakdown voltage and an increase in junction capacitance in the region under the source/drain regions.

Furthermore, as shown in FIG. 6(b), a structure having a third thick gate oxide layer 8 can be formed in the vicinity of the both ends of a gate electrode 12, i.e., in the vicinity of the source/drain regions. Thus, GIDL (gate induced drain leakage current) can be reduced, thereby reducing power consumption.

In the second embodiment, each of the first and second resist layers Pr21, Pr22 used in each of the steps shown in FIGS. 5(a) and 5(c), is opened only above the threshold control layer. However, each of the first and second resist layers Pr21, Pr22 is not necessarily opened above the threshold control layer. If either resist layer is opened only above the threshold control layer of a MOSFET, the effects specific to the second embodiment can be attained in the corresponding region.

Embodiment 3

Figure 8A:
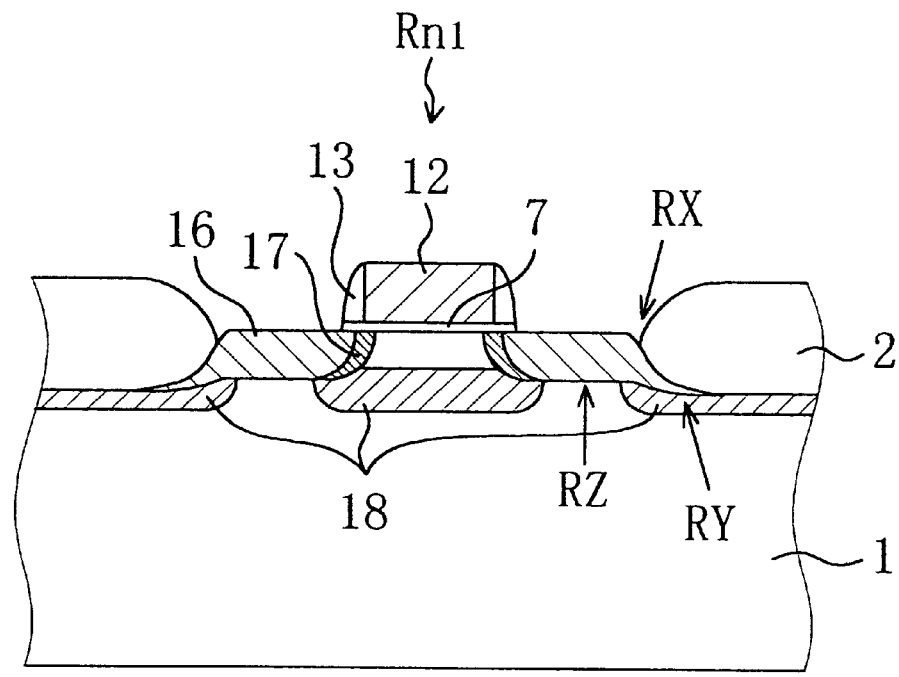
FIGS. 8(a) and 8(b) are cross-sectional views of a thin-layer NMOSFET formed by the method for producing a semiconductor device in the third embodiment.
Figure 8B:
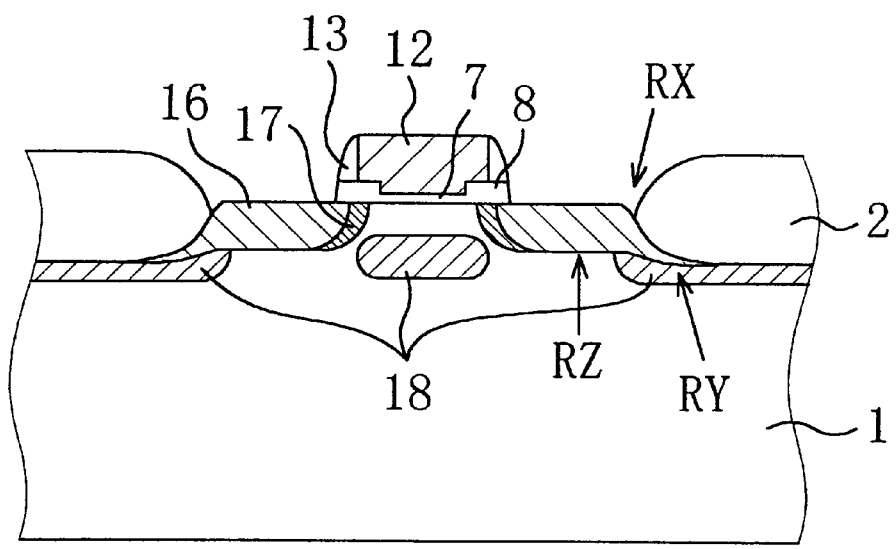

Hereinafter, a method for producing a semiconductor device of the third embodiment will be described. FIGS. 7(a) to 7(e) are cross-sectional views illustrating the main steps of a method for producing a semiconductor device in the third embodiment. FIGS. 8(a) and 8(b) are cross-sectional views of a thin-layer NMOSFET formed by the method for producing a semiconductor device in the third embodiment.

The steps shown in FIGS. 7(a) to 7(e) are basically identical with the steps in FIGS. 1(a) to 1(c) and 2(a) to 2(c) in the first embodiment or the steps shown in FIGS. 5(a) to 5(f) in the second embodiment, except for the following points. The third embodiment differs from each of the first and second embodiments in that each of a first resist layer Pr31 used in a step shown in FIG. 7(a) and a second resist layer Pr32 used in a step shown in FIG. 7(c), is not opened entirely over a MOSFET forming region, but is opened only above a portion thereof to be a MOSFET channel region, and is also opened only in the vicinity of the ends of LOCOS layers 2.

As shown in FIGS. 8(a) and 8(b), a thin-layer NMOSFET, formed by the method for producing a semiconductor device of the third embodiment, is provided with P− layers 18 functioning as a punch-through stopper or channel stopper. This NMOSFET has a structure in which the P− layers 18 are not present under the source/drain regions. Accordingly, the third embodiment can not only attain the same effects as those attained by the first embodiment, but also suppress both a reduction in junction breakdown voltage and an increase in junction capacitance between the P− layers 18 and the N+ layers 16 functioning as source/drain regions in the regions Rz in FIG. 8.

Embodiment 4

Hereinafter, a method for producing a semiconductor device functioning as a CMOSFET in the fourth embodiment will be described. FIGS. 9(a) to 9(e) are cross-sectional views illustrating the main steps of the method for producing a semiconductor device in the fourth embodiment.

Unlike the first to the third embodiments, the semiconductor device of the fourth embodiment is formed such that the gate oxide layers have the same thickness and that an NMOSFET forming region Rn and a PMOSFET forming region Rp are formed on a Si substrate 1.

In a step shown in FIG. 9(a), LOCOS layers 2 are formed on the Si substrate 1 for defining the NMOSFET forming region Rn and the PMOSFET forming region Rp, and a P well 3 and an N well 4 are respectively formed in the NMOSFET forming region Rn and the PMOSFET forming region Rp. The P well 3 and the N well 4 are formed through the diffusion of an impurity introduced to the surface of the substrate. Then, an oxidation process is performed to form protective oxide layers 25 on the surface of the Si substrate 1. Then, a first resist layer Pr41, which is opened only above the NMOSFET forming region Rn, is formed. By using this first resist layer Pr41 as a mask, B+ ions are implanted into the NMOSFET forming region Rn for forming an NMOSFET threshold control layer 10 and for forming a P− layer 18 functioning as a punch-through stopper or channel stopper. The ion implantation is performed twice while varying implantation energy and implantation amount. During this step, a foreign impurity, adversely affecting the properties of the gate oxide layers and the like, are also implanted into the oxide layers.

In a step shown in FIG. 9(b), by using the first resist layer Pr41 as a mask, etching is performed to remove the protective oxide layer 25 and portions of the LOCOS layers 2 in the vicinity of the surface thereof in the NMOSFET forming region Rn. Thus, the foreign impurity, existing in the protective oxide layer 25 and in the vicinity of the surface of the LOCOS layers 2, is also removed from the NMOSFET forming region Rn, before the foreign impurity diffuses the surrounding regions.

In a step shown in FIG. 9(c), the first resist layer Pr41 is removed, and then a second resist layer Pr42, opened over the PMOSFET forming region Rp, is formed. By using this second resist layer Pr42 as a mask, B+ ions are implanted into the PMOSFET forming region Rp for forming a threshold control layer 11 and for forming an N− layer 19 functioning as a punch-through stopper or channel stopper. At the same time, a foreign impurity, adversely affecting the properties of the gate oxide layers and the like, is introduced into the oxide layer.

In a step shown in FIG. 9(d), by using the second resist layer Pr42 as a mask, etching is performed to remove the protective oxide layer 25 from the PMOSFET forming region Rp. Thus, the foreign impurity, existing in the protective oxide layer 25 and in the vicinity of the surface of the LOCOS layers 2 is also removed from the PMOSFET forming region Rp, before the foreign impurity diffuses the surrounding regions.

In a step shown in FIG. 9(e), the second resist layer Pr42 is removed, and a gate electrode 12 and a gate oxide layer 27 are formed in each of the regions Rn, Rp. Then, N− layers 17 functioning as NMOSFET LDDs (low-concentration source/drain regions) and P− layers 15 functioning as PMOSFET LDDs are formed. Then, sidewalls 13 are formed on the sides of each of the gate electrodes 12.

Then, N+ layers 16 functioning as source/drain regions and P+ layers 14 functioning as source/drain regions are respectively formed in the NMOSFET forming region Rn and the PMOSFET forming region Rp.

If, in the step shown in FIG. 9(a), B+ ions are implanted at acceleration energy of about 100 keV, for example, the P− layer 18 can be formed such that a peak of impurity concentration is located in a deep position under the NMOSFET threshold control layer 10. That is to say, this P− layer 18 functions as a punch-through stopper for suppressing the short-channel effect of the NMOSFET. Also, if, in the step shown in FIG. 9(a), B+ ions are implanted at acceleration energy of about 150 keV, for example, the P− layer 18 can be formed such that a peak of impurity concentration is located in a deep position under the lower ends of the LOCOS layers 2. That is to say, this P− layer 18 functions as a channel stopper for enhancing the isolation function of the LOCOS layers 2. By using the first resist layer Pr41 as a mask, the ion implantation may be performed three times at three different acceleration energy values to form a threshold control layer, a punch-through stopper and a channel stopper, respectively.

As to the PMOSFET forming region Rp, if the P+ ions are implanted at acceleration energy of about 150 keV in the step shown in FIG. 9(c), the N− layer 19 thus formed functions as a punch-through stopper for suppressing the short-channel effect of the PMOSFET. If this ion implantation is performed at acceleration energy of about 300 keV for example, the N− layer 19 thus formed functions as a channel stopper for enhancing the isolation function. By using the second resist layer Pr42 as a mask, the ion implantation may be performed three times at three different acceleration energy values to form a threshold control layer, a punch-through stopper and a channel stopper, respectively.

According to the method for producing a semiconductor device of the fourth embodiment, a semiconductor device having satisfactory gate oxide layers can be formed as a semiconductor device functioning as a general CMOSFET, in the same way as in the first embodiment. More specifically, in the step shown in FIG. 9(a), by using the first resist layer Pr41 as a mask, B+ ions are implanted into the NMOSFET forming region Rn in order to form the threshold control layer 10, the punch-through stopper and the like. During this step, not only the B+ ions but also a foreign impurity, adversely affecting the properties of the gate oxide layers and the like, are introduced. Immediately after the step in FIG. 9(a) has been performed, however, the Si substrate 1 is etched for removing the protective oxide layer 25 in the step shown in FIG. 9(b). Thus, the foreign impurity can also be removed before the impurity diffuses the surrounding regions. Consequently, it is possible to securely prevent the foreign impurity, introduced in the ion implantation step, from diffusing the surrounding regions, unlike a conventional method for producing a semiconductor device. Similarly, in the steps shown in FIGS. 9(c) and 9(d), the foreign impurity, introduced into the PMOSFET forming region Rp in the ion implantation step, can be removed before the foreign impurity diffuses the surrounding regions. And then, if the gate oxide layers 27 are formed in the step shown in FIG. 9(e), gate oxide layers having good properties, in which the foreign impurity, introduced simultaneously with the implanted impurity ions, is not diffusing can be obtained.

In the fourth embodiment, the punch-through stoppers, the channel stoppers and the threshold control layers are formed on the Si substrate 1 in which the wells 3, 4 have already been formed. However, in the fourth embodiment, the P well 3 may be formed by implanting B+ ions at high energy by using the first resist layer Pr41 as a mask, and the N well 4 may be formed by implanting P+ ions at high energy by using the second resist layer Pr42 as a mask.

Embodiment 5

Hereinafter, a method for producing a semiconductor device functioning as a CMOSFET in the fifth embodiment will be described. FIGS. 10(a) to 10(d) are cross-sectional views illustrating the steps of a method for producing a semiconductor device in the fifth embodiment.

In the method for producing a semiconductor device of the fifth embodiment, the present invention is applied to a so-called retrograde well production method for forming an N well and a P well by ion implantation. A P well forming region is defined as an NMOSFET forming region Rn and an N well forming region is defined as a PMOSFET forming region Rp.

Figure 10A:
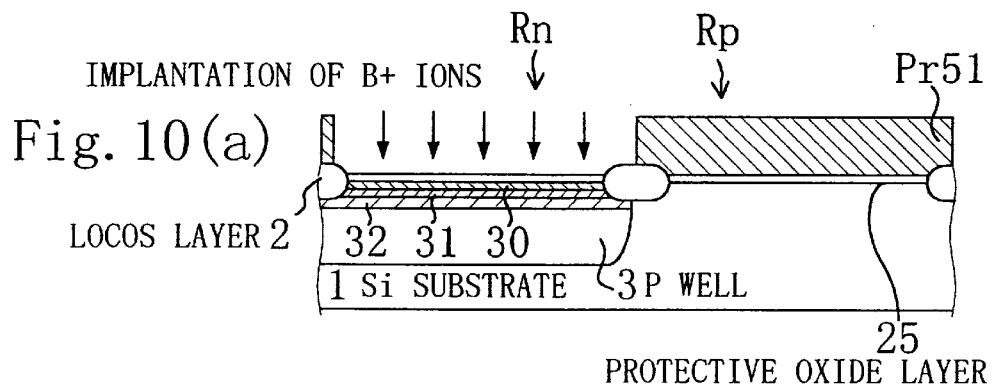

In a step shown in FIG. 10(a), the LOCOS layers 2 are formed on the Si substrate 1. Then, an oxidation process is performed to form protective oxide layers 25 on the surface of the Si substrate 1. Then, a first resist layer Pr51, opened only above the NMOSFET forming region Rn, is formed. By using this first resist layer Pr51 as a mask, B+ ions are implanted into the NMOSFET forming region Rn for forming a P well 3. The ion implantation is performed at implantation energy of 400 keV and at a dose of about $5 \times 10^{12}$ cm$^{-2}$. Further, by using the first resist layer Pr51 as a mask, B+ ions are implanted three times for forming an NMOSFET threshold control layer 30, a punch-through stopper 31 (at acceleration energy of about 100 keV, for example) and a channel stopper 32 (at acceleration energy of about 150 keV, for example) while varying the implantation energy and amount. During this step, a foreign impurity, adversely affecting the properties of the gate oxide layers or the like, is also introduced.

Figure 10B:
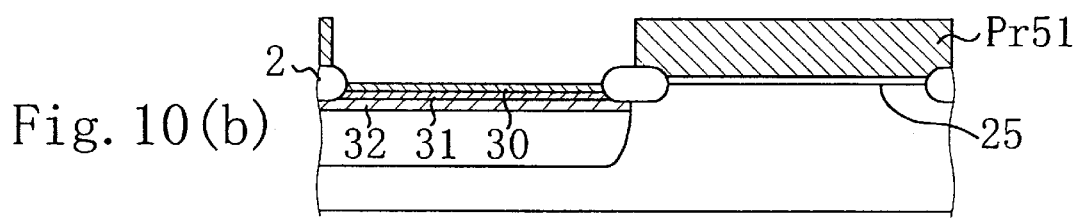

In a step shown in FIG. 10(b), by using the first resist layer Pr51 as a mask, etching is performed to remove the protective oxide layer 25 and portions of the LOCOS layers 2 in the vicinity of the surface thereof in the NMOSFET forming region Rn. Thus, the foreign impurity, existing in the protective oxide layer 25 and in the vicinity of the surface of the LOCOS layers 2, is also removed from the region Rn, before the foreign impurity diffuses the surrounding regions.

Figure 10C:
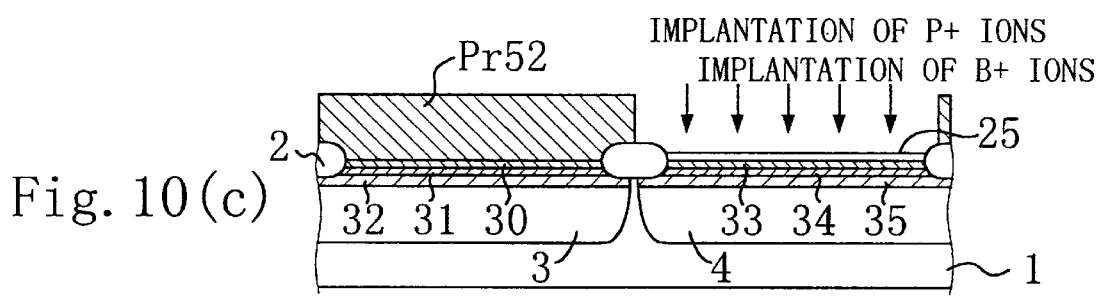

In a step shown in FIG. 10(c), the first resist layer Pr51 is removed, and then a second resist layer Pr52, opened in the PMOSFET forming region Rp, is formed. By using this second resist layer Pr52 as a mask, P+ ions are implanted into the PMOSFET forming region Rp for forming an N well 4. The ion implantation is performed at implantation energy of 800 keV and a dose of about $1 \times 10^{13}$ cm$^{-2}$. Further, by using the second resist layer Pr52 as a mask, B+ ions are implanted for forming a threshold control layer 33, and P+ ions are implanted for forming a punch-through stopper 34 (at acceleration energy of about 150 keV, for example) and for forming a channel stopper 35 (at acceleration energy of about 300 keV, for example). During this step, a foreign impurity, adversely affecting the properties of the gate oxide layers or the like, is also introduced.

Figure 10D:
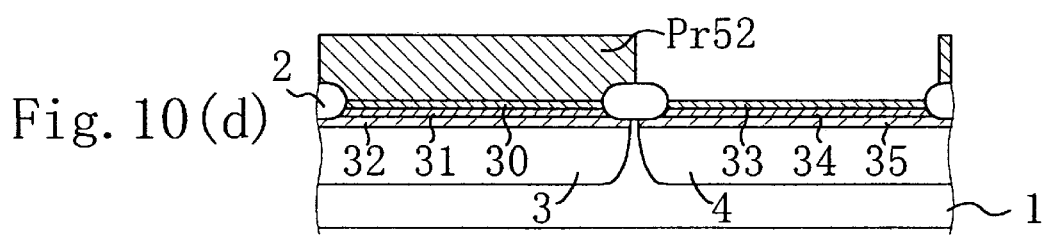
Figure 11A:
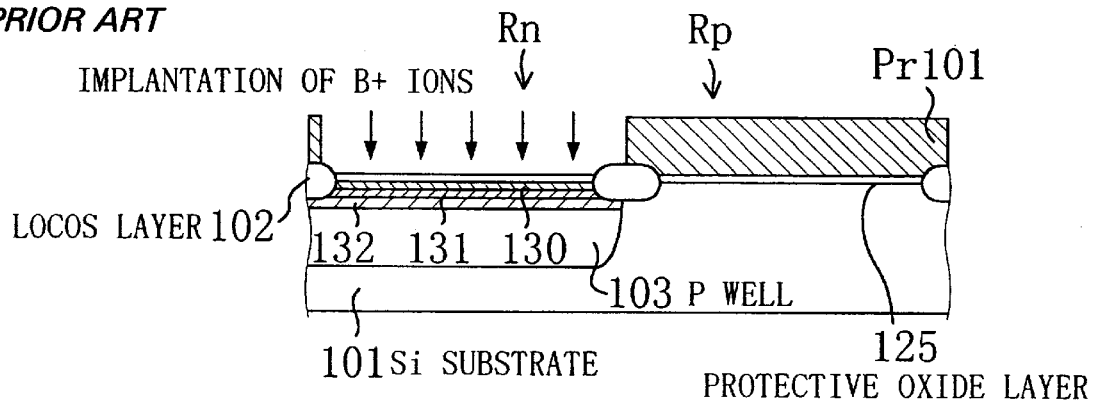
Figure 11B:
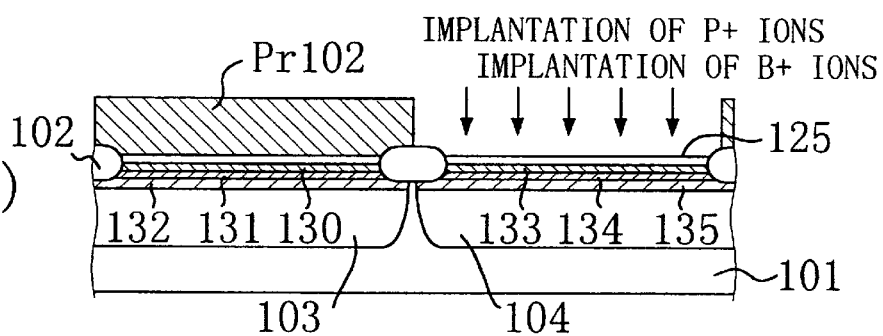
Figure 11C:
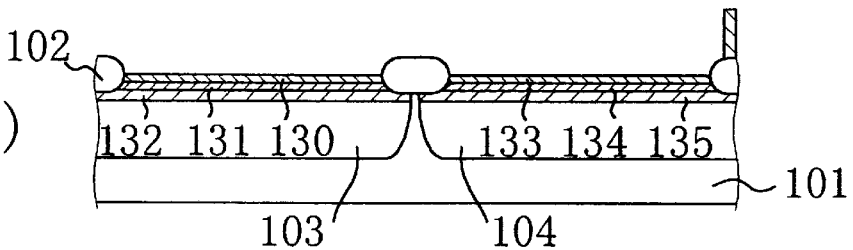

In a step shown in FIG. 10(d), by using the second resist layer Pr52 as a mask, etching is performed to remove the protective oxide layer 25 from the PMOSFET forming region Rp. Thus, the foreign impurity, existing in the protective oxide layer 25 and in the vicinity of the surface of the LOCOS layers 2 is also removed from the PMOSFET forming region Rp, before the foreign impurity diffuses the surrounding regions.

Although the illustration of subsequent steps is omitted, gate oxide layers, gate electrodes, source/drain regions and the like are formed in the NMOSFET forming region Rn and PMOSFET forming region Rp, thereby forming an NMOSFET and a PMOSFET, respectively. The foreign impurity, which has been introduced at the time of ion implantation, has hardly diffused in the gate oxide layers thus formed.

In the method for producing a semiconductor device of the fifth embodiment, when a retrograde well is formed through the implantation of impurity ions, B+ ions are implanted into the NMOSFET forming region Rn for forming the P well 3 and the like by using the first resist layer Pr51 as a mask. During this step, not only the B+ ions but also the foreign impurity, adversely affecting the properties of the gate oxide layers and the like, are also introduced. Immediately after that, however, the Si substrate 1 is etched for removing the protective oxide layer 25 from the region Rn in the step shown in FIG. 10(b). Thus the foreign impurity is also removed before the impurity diffuses the surrounding regions. Similarly, in the steps shown in FIGS. 10(c) and 10(d), the foreign impurity, which has been introduced into the PMOSFET forming region Rp during the ion implantation, can be removed before the foreign impurity diffuses the surrounding regions. Thus, it is possible to prevent the foreign impurity, introduced in the ion implantation step, from diffusing the surrounding regions, unlike a conventional method for producing a semiconductor device. When gate oxide layers are formed on the Si substrate 1, it is possible to obtain the gate oxide layers having good properties in which the foreign impurity, introduced simultaneously with the implanted impurity ions, is not diffusing. That is to say, a variety of semiconductor devices having good gate oxide layers can be formed.

In the fifth embodiment, by using the resist layers as a mask for forming the wells, the threshold control layers 30, 31, the punch-through stoppers 31, 34 and the channel stoppers 32, 35 are formed. However, it is not necessarily required to form these layers and stoppers. The present invention can also attain some effects even when only the P well 3 and the N well 4 are formed.

Furthermore, according to the present invention, after only the P well 3 and N well 4 have been formed by the method for producing a semiconductor device of the fifth embodiment, the steps shown in FIGS. 1(a) to 1(c) and FIGS. 2(a) to 2(c) may be performed. In this case, two NMOSFET forming regions Rn, each surrounded by LOCOS layers, and two PMOSFET forming regions Rp, each surrounded by LOCOS layers, need to be formed.

What is claimed is:

1. A method for producing a semiconductor device including a MISFET of a first conductivity type and a MISFET of a second conductivity type, the method comprising:

a first step of forming, on a semiconductor substrate having a semiconductor region, an element-isolating insulating layer for dividing said semiconductor region into a first-conductivity-type MISFET forming region and a second-conductivity-type MISFET forming region;

a second step of forming a protective insulating layer on a surface of said semiconductor substrate;

a third step of forming, on said protective insulating layer, a first resist layer having an opening above at least a part of said first-conductivity-type MISFET forming region;

a fourth step of implanting, from above said protective insulating layer, additive impurity ions into said semiconductor substrate at least once by using said first resist layer as a mask;

a fifth step of performing etching by using said first resist layer as a mask, until a portion of said protective insulating layer, which is exposed through said opening of said first resist layer, is removed after the fourth step has been performed;

a sixth step of removing said first resist layer after the fifth step has been performed;

a seventh step of forming, on said substrate, a second resist layer having an opening above said second-conductivity-type MISFET forming region, after the sixth step has been performed;

an eighth step of implanting, from above said protective insulating layer, additive impurity ions into said semiconductor substrate at least once by using said second resist layer as a mask;

a ninth step of performing etching by using said second resist layer as a mask, until a portion of said protective insulating layer, which is exposed through said opening of said second resist layer, is removed after the eighth step has been performed; and a tenth step of removing said second resist layer after the ninth stop has been performed.

2. The method for producing a semiconductor device of claim 1, wherein at least one of the fourth and the eighth steps of implanting additive impurity ions includes implanting additive impurity ions for forming a well.

3. The method for producing a semiconductor device of claim 1, wherein at least one of the fourth and the eighth steps of implanting additive impurity ions includes implanting additive impurity ions for controlling a threshold value.

4. The method for producing a semiconductor device of claim 1, wherein at least one of the fourth and the eighth steps of implanting additive impurity ions includes implanting additive impurity ions for forming a punch-through stopper.

5. The method for producing a semiconductor device of claim 1, wherein at least one of the fourth and the eighth steps of implanting additive impurity ions includes implanting additive impurity ions for forming a channel stopper.

6. The method for producing a semiconductor device of claim 1, further comprising a step of forming a gate insulating layer on said semiconductor substrate after the tenth step has been performed.

7. A method for producing a semiconductor device including a low-voltage MISFET of a first conductivity type, a low-voltage MISFET of a second conductivity type, a high-voltage MISFET of the first conductivity type and a high-voltage MISFET of the second conductivity type, the method comprising:

a first step of forming, on a substrate having a semiconductor region, element-isolating insulating layers for dividing said semiconductor region into a low-voltage first-conductivity-type MISFET forming region, a low-voltage second-conductivity-type MISFET forming region, a high-voltage first-conductivity-type MISFET forming region, and a high-voltage second-conductivity-type MISFET forming region;

a second step of forming a first gate insulating layer on a surface of said semiconductor substrate;

a third step of forming, on said first gate insulating layer, a first resist layer having an opening above a region including at least a portion of the channel region of said low-voltage first-conductivity-type MISFET forming region;

a fourth step of implanting, from above said first gate insulating layer, additive impurity ions into said semiconductor substrate at least once by using said first resist layer as a mask;

a fifth step of performing etching by using said first resist layer as a mask, until a portion of said first gate insulating layer, which is exposed through said opening of said first resist layer, is removed;

a sixth step of removing said first resist layer;

a seventh step of forming, on said semiconductor substrate, a second resist layer having an opening above a region including at least a portion of the channel region of said low-voltage second-conductivity-type MISFET forming region;

an eighth step of implanting, from above said first gate insulating layer, additive impurity ions into said semiconductor substrate at least once by using said second resist layer as a mask;

a ninth step of performing etching by using said second resist layer as a mask, until a portion of said first gate insulating layer, which is exposed through said opening of said second resist layer, is removed;

a tenth step of removing said second resist layer and then forming a second gate insulating layer on the substrate;

an eleventh step of forming a gate electrode on each said gate insulating layer of each said MISFET forming region; and a twelfth step of forming a source region and a drain region respectively, in a pair of regions which sandwich each said gate electrode in each said MISFET forming region.

8. The method for producing a semiconductor device of claim 7, wherein said opening of at least one of said first and second resist layers is open only above the gate electrode forming region.

9. The method for producing a semiconductor device of claim 7, wherein said opening of at least one of said first and second resist layers includes ends of the element-isolating insulating layers and the source and drain regions of the corresponding low-voltage first- or second-conductivity-type MISFET.

10. The method for producing a semiconductor device of claim 7, wherein said opening of at least one of said first and second resist layers is opened only above ends of the element-isolating insulating layers and the channel region of the corresponding low-voltage first- or second-conductivity-type MISFET.

11. The method for producing a semiconductor device of claim 7, wherein at least one of the fourth and the eighth steps of implanting additive impurity ions includes: a first step of implanting additive impurity ions for controlling a threshold voltage; and a second step of implanting additive impurity ions at least once at implantation energy higher than energy in the first step.

12. The method for producing a semiconductor device of claim 11, wherein the second step of implanting additive impurity ions includes implanting additive impurity ions for forming a well.

13. The method for producing a semiconductor device of claim 11, wherein the second step of implanting additive impurity ions includes implanting additive impurity ions for forming a punch-through stopper.

14. The method for producing a semiconductor device of claim 11, wherein the second step of implanting additive impurity ions includes implanting additive impurity ions for forming a channel stopper.

15. The method for producing a semiconductor device of claim 11, wherein said first conductivity type is an N type and said second conductivity type is a P type, and wherein P-type additive impurity ions are implanted twice in the fourth step with respectively different acceleration energy and doses, and wherein N-type additive impurity ions are implanted once and P-type additive impurity ions are implanted once in the eighth step.

* * * * *